US008804406B2

(12) United States Patent
Rachamadugu et al.

(10) Patent No.: US 8,804,406 B2
(45) Date of Patent: Aug. 12, 2014

(54) CONDITIONAL READ-ASSIST FEATURE TO ACCELERATE ACCESS TIME IN AN ELECTRONIC DEVICE

(75) Inventors: Vinod Rachamadugu, Andhra Pradesh (IN); Setti Shanmukheswara Rao, Karnataka (IN)

(73) Assignee: LSI Corporation, San Jose, CA (US)

( * ) Notice: Subject to any disclaimer, the term of this patent is extended or adjusted under 35 U.S.C. 154(b) by 324 days.

(21) Appl. No.: 13/483,197

(22) Filed: May 30, 2012

(65) Prior Publication Data
US 2013/0322194 A1 Dec. 5, 2013

(51) Int. Cl.
*G11C 11/00* (2006.01)
(52) U.S. Cl.
USPC .......................... 365/154; 365/203; 365/205
(58) Field of Classification Search
CPC ............... G11C 16/26; G11C 13/004; G11C 2013/0054; G11C 11/403
USPC .......................... 365/154, 203, 205
See application file for complete search history.

(56) References Cited

U.S. PATENT DOCUMENTS

| 4,578,778 | A | 3/1986 | Aoyoma |
| 5,579,500 | A | 11/1996 | Sekibe et al. |
| 5,691,956 | A | 11/1997 | Chang et al. |
| 5,999,469 | A | 12/1999 | Brown |
| 6,092,151 | A | 7/2000 | Park |
| 6,259,639 | B1 | 7/2001 | Hashizume |
| 6,449,197 | B1 * | 9/2002 | Hiraki et al. ............. 365/189.05 |
| 6,519,197 | B2 | 2/2003 | Forbes |
| 7,295,481 | B2 | 11/2007 | Pilles |
| 2005/0117421 | A1 | 6/2005 | Pille et al. |
| 2011/0273945 | A1 | 11/2011 | Donkoh |

* cited by examiner

*Primary Examiner* — Son Dinh
*Assistant Examiner* — Nam Nguyen
(74) *Attorney, Agent, or Firm* — Otterstedt, Ellenbogen & Kammer, LLP

(57) ABSTRACT

An electronic storage device includes a bit cell circuit, feedback circuit, and read accelerator circuit. The bit cell circuit is adapted for connection with true and complementary bit lines. The feedback circuit includes a first transistor which is coupled to a first voltage potential and responsive to the complementary bit line. The read accelerator circuit includes second, third, and fourth transistors coupled between the feedback circuit and a second voltage potential. The second transistor is responsive to a read line, the third transistor is responsive to the true bit line, and the fourth transistor is responsive to the complementary bit line. The read accelerator circuit is configured to provide a discharge path for at least one of the true bit line and the complementary bit line during a read access of the bit cell. Embodiments of a corresponding electronic read access accelerator device and method are also provided.

26 Claims, 4 Drawing Sheets

CONDITIONAL READ-ASSIST FEATURE TO ACCELERATE ACCESS TIME IN AN ELECTRONIC DEVICE

BACKGROUND

In modern memory devices, read access time is an important timing parameter that limits the overall cycle times of the memory devices. Read access time is generally determined as a sum of the time required to generate a word line signal, the time required to discharge the bit line, the time required to sense a signal developed on the bit line, and the time required to transfer accessed data to a read output port. While there have been several techniques proposed for reducing the read access time of a memory, such techniques have not been successful in achieving a sufficient improvement in memory cycle time.

SUMMARY

Embodiments of the invention include methods, devices, and systems for increasing the speed and performance of memory devices. More particularly, embodiments of the invention reduce access times required during read operations in such memory devices.

In accordance with one embodiment of the invention, an electronic storage device is provided which includes a bit cell circuit, a feedback circuit, and a read accelerator circuit. The bit cell circuit is adapted for connection with a true bit line and a complementary bit line in the storage device. The feedback circuit includes a first transistor which is operatively coupled to a first voltage potential and responsive to the complementary bit line. The read accelerator circuit includes second, third, and fourth transistors operatively coupled between the feedback circuit and a second voltage potential. The second transistor is responsive to a read line, the third transistor is responsive to the true bit line, and the fourth transistor is responsive to the complementary bit line. The read accelerator circuit is configured to provide a discharge path for at least one of the true bit line and the complementary bit line during a read access of the bit cell.

In accordance with other embodiments of the invention, a corresponding electronic read access accelerator device and method are also provided.

Embodiments of the invention will become apparent from the following detailed description, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
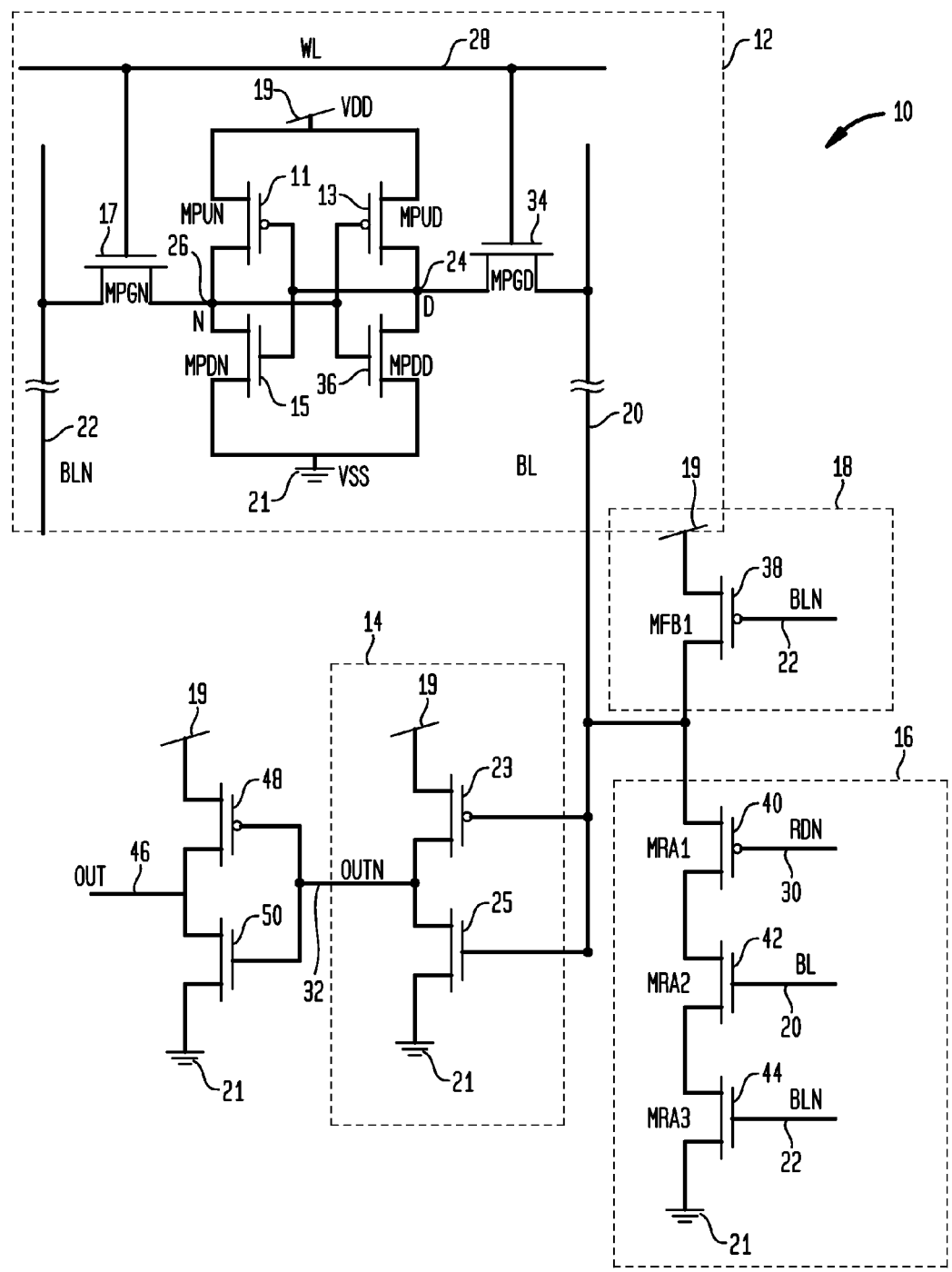
FIG. 1 is a schematic diagram depicting at least a portion of an exemplary memory circuit incorporating a read-assist feature, according to an embodiment of the invention.

It is to be appreciated that elements in the figures are illustrated for simplicity and clarity. Common but well-understood elements that are useful in a commercially feasible embodiment are not necessarily shown in order to facilitate a less hindered view of the illustrated embodiments.

DETAILED DESCRIPTION

Embodiments of the invention will be described herein in the context of methods, devices, and systems for reducing read access time in a memory or other read-accessible device when compared to standard methods, devices, and systems. It should be understood, however, that embodiments of the invention are not limited to these or any other particular methods, devices, and systems. Rather, embodiments of the invention are more generally applicable to techniques for increasing the speed and performance of memory and other read-accessible devices during read access operations. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Although embodiments of the invention will be described herein in the context of static random access memory (SRAM), it is to be understood that techniques according to embodiments of the invention are similarly applicable to other memory types, including, for example, flash memory, dynamic random access memory (DRAM), content-addressable memory (CAM), read-only memory (ROM), electronically programmable read-only memory (EPROM), electrically erasable programmable read-only memory (EEPROM), etc., either embedded or not (e.g., discrete or standalone memory) and either single-port or multiport. Moreover, for the purpose of describing and claiming embodiments of the invention, the term MISFET as used herein is intended to be construed broadly to encompass any type of metal-insulator-semiconductor field-effect transistor. The term MISFET is, for example, intended to encompass semiconductor field-effect transistors that utilize an oxide material as their gate dielectric (i.e., MOSFETs), as well as those that do not. In addition, despite a reference to the term "metal" in the acronym MISFET, the term MISFET is also intended to encompass semiconductor field-effect transistors wherein the gate is formed from a non-metal such as, for instance, polysilicon.

Although implementations of the present invention described herein may be implemented using p-channel MISFETs (hereinafter called "PMOS" (p-channel metal-oxide-semiconductor) or "PFET" (p-channel field-effect transistor) devices) and n-channel MISFETs (hereinafter called "NMOS" (n-channel metal-oxide-semiconductor) or NFET (n-channel field-effect transistor) devices), as may be formed using a complementary metal-oxide-semiconductor (CMOS) fabrication process, it is to be appreciated that the invention is not limited to such transistor devices and/or such a fabrication process, and that other suitable devices, such as, for example, FinFETs, bipolar junction transistors (BJTs), etc., and/or fabrication processes (e.g., bipolar, BiCMOS, etc.), may be similarly employed, with or without modification to the circuits described herein, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Embodiments of the present invention provide a robust read-assist feature that decreases read access times associated with memory devices while reducing memory yield losses during fabrication of high-performance, high-density memory devices. Read access time is reduced by using a conditional increase in a bit line discharge rate, and automatic bit line clamping to avoid false read accesses during unwanted read access acceleration. As stated above, these embodiments are applicable to flash memory and random access memories (RAMs) having single or multiple read ports, ROMs, and CAMs with a read option. The embodiments are also applicable to circuits, such as, but not limited to, serializer/deserializers (SERDES), phase-locked loop (PLL) circuits, timing circuits, amplifiers, input/output buffers, and the like.

CAM, unlike ROM or RAM in which the user supplies a memory address and the memory device returns a data word stored at that address, is designed such that the user supplies a data word and the CAM searches its entire memory contents to determine if that data word is stored therein. If the data word is found, the CAM returns a list of one or more storage addresses in which the word was found and, in some architectures, returns the data word, or other associated data. Thus, CAM is a hardware embodiment of an associative array, which is typically referred to in relation to software.

A SERDES includes a pair of functional blocks used in high-speed communication to compensate for limited input/output capabilities. A SERDES bidirectionally converts data between serial and parallel interfaces and is widely used in data communication systems.

A PLL is an electronic control system that generates an output signal having a phase related to the phase of an input reference signal. PLLs include a variable frequency oscillator and phase detector. PLLs compare the phase of an input signal with the phase of a signal derived from the variable frequency oscillator and adjust the frequency of the oscillator to match the phases. The signal from the phase detector is used to control the oscillator in a feedback loop.

Read access time is a critical timing parameter that limits the overall cycle time of memory devices. High-speed caches, register files, and port buffer memories, among other applications, utilize single- and multiple-port SRAM with relatively short access times. Circuit and architectural techniques are used to increase the speed associated with read data paths in SRAM and register files, thereby increasing the speed of data flow through logic circuits.

Read access time is determined as a sum of the time to generate a word line, the time to discharge a bit line, the time to sense the bit line, and the time to transfer accessed data to a read output port. During a read operation, a selected memory cell (or bit cell) in a memory device transfers its stored charge onto a corresponding bit line (of pair of bit lines, in a differential sensing architecture) coupled with the memory cell. The voltage developed on the bit line is adapted to provide a signal of sufficient duration and amplitude so as to ensure that a sense amplifier in the memory is able to accurately resolve and digitize the signal. The signal developed on the bit line is a linear function of the read current. With increased memory densities above 100 Mb/die and predominant statistical local variations in die parameters, the read current degrades significantly across the die. This reduction in read current becomes a bottleneck which affects the bit line discharge rate and significantly degrades the read access time of the resulting memory device.

Embodiments herein increase the speed of read accesses by implementing a conditional acceleration of the bit line discharge rate and a conditional bit line clamping to avoid false read accesses during unwanted read accelerations. The "conditional" feature of the embodiments herein refers to the acceleration of the bit line discharge rate being dependent upon a logical state of the data being read; i.e., the condition of whether a logic low level or a logic high level is being read.

Figure 2:
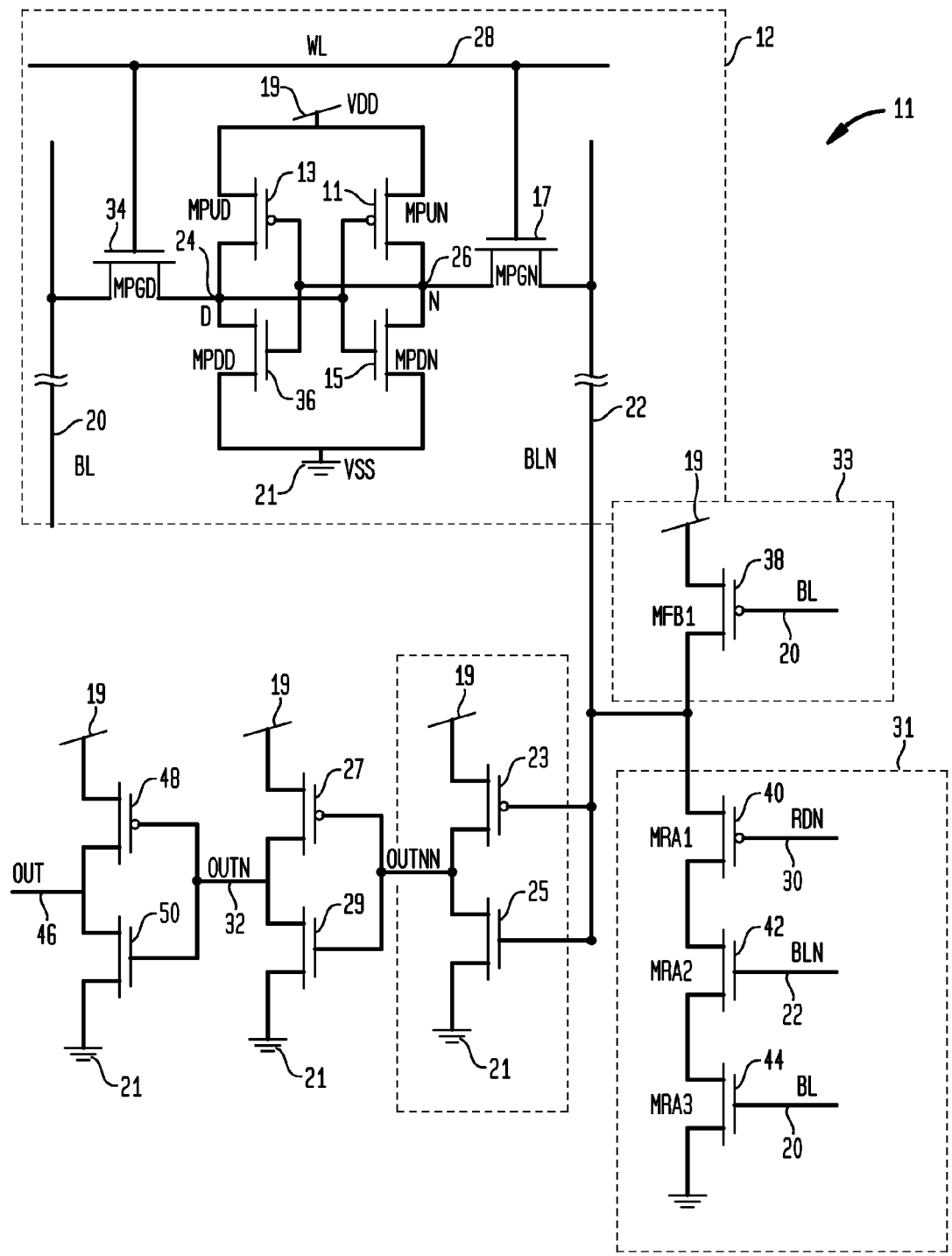
FIG. 2 is a schematic diagram depicting at least a portion of an exemplary memory circuit incorporating a read-assist feature, according to another embodiment of the invention.

By way of example only and without loss of generality, FIG. 1 is a schematic diagram depicting at least a portion of an exemplary memory circuit 10 incorporating a read-assist feature, according to a first embodiment of the invention. As will be described in further detail below, during a read access of a logic low level, a true bit line 20 is connected to an inverter sense amplifier circuit 14. Alternatively, FIG. 2 is a schematic diagram depicting at least a portion of an exemplary memory circuit 11 incorporating a read-assist feature, according to a second embodiment of the invention. In the second embodiment, a complementary bit line 22 is connected to the inverter sense amplifier circuit 14 during a read access of a logic high level. Advantageously, in the first embodiment, during the read access of a logic low level, the bit line discharge rate is accelerated and during the read access of a logic high level the bit line is conditionally clamped to avoid unwanted read acceleration.

Device parameters are typically monitored using electrical test structures that test individual devices on dies in the wafer. This data is useful for monitoring across-wafer variations in device parameters and verifying robustness of design rules within the bit cell. However, this data is not as useful for obtaining detailed intra-die and location variations in device mismatches, which are used to determine SRAM bit cell functionality. Ring oscillators, which are commonly used to monitor performance, are useful to determine how centered a process is with respect to the target. However, the delay measured within the ring oscillator is obtained by averaging over many devices in the ring, and thus does not provide sufficient information regarding variability of individual devices.

It is to be noted that most variations measured across a wafer arise from local variations. That is, for narrow-width devices, such as those in SRAM bit cells, local mismatch variations dominate detectable variations. For example, assuming a 300-mm wafer, and using memory incorporating a conditional read-assist feature to decrease read access times, the local variation (or standard deviation) of SRAM bit cell current was experimentally determined to be about four times greater than that across the wafer. This observation is not surprising considering the magnitude of local device variations. Generally, with reference to FIGS. 1 and 2, complementary bit lines 20 and 22 are pre-charged to VDD after a successful read operation. Therefore, if the read access time is reduced, the total read cycle time is beneficially reduced.

With reference again to FIG. 1, the exemplary memory circuit 10 includes a bit cell circuit 12, inverter sense amplifier circuit 14, read accelerator circuit 16, and feedback circuit 18. Transistors 48 and 50, which in this embodiment are PMOS and NMOS transistors, respectively, provide an output buffering and inversion stage. Although not explicitly shown, the memory circuit 10 may also include a latch circuit coupled with an output (OUT) 46 of the memory circuit for at least temporarily storing a state of the sense amplifier 14. The bit cell circuit 12 represents a six-transistor (6T) SRAM bit cell. However, it is to be noted that the embodiments herein are equally applicable to any bit cell adapted for connection with a bit line that is sensed.

The bit cell circuit 12 comprises a pair of cross-coupled inverters connected with a pair of complementary bit lines via corresponding access devices. Specifically, the bit cell circuit 12 includes PMOS transistors 11 and 13 and NMOS transistors 15, 17, 34 and 36. Gates of transistors 13 and 36 are connected to transistors 11, 15 and 17. Likewise, gates of transistors 11 and 15 are connected to transistors 13, 34 and 36. Gates of transistors 17 and 34 are connected to a corresponding write line (WL) 28. Transistor 17 is connected to a complementary bit line (BLN) 22, and transistor 34 is connected to a true bit line (BL) 20. Transistors 11 and 13 are adapted for connection with VDD or an alternative voltage supply 19. Transistors 15 and 36 are connected to VSS or ground potential 21.

The read accelerator circuit 16 includes PMOS transistor 40 and NMOS transistors 42 and 44. The feedback circuit 18 includes PMOS transistor 38, which is connected in series between transistor 40 of the read accelerator circuit 16 and VDD 19. Transistors 40, 42 and 44 are connected in series between transistor 38 and VSS 21. A gate of transistor 38 is connected to the complementary bit line 22, a gate of transistor 40 is connected to a read line 30 (RDN), a gate of transistor 42 is connected to the true bit line 20, and a gate of transistor 44 is connected to the complementary bit line 22. The inverter sense amplifier circuit 14 includes PMOS transistor 23 and NMOS transistor 25, which are connected in series between VDD 19 and VSS 21. Gates of transistors 23 and 25 are connected together and are connected to transistors 38 and 40, and the true bit line 20. Gates of PMOS transistor 48 and NMOS transistor 50 are connected together and are also connected to transistors 23 and 25. Transistors 48 and 50 are connected in series between VDD 19 and VSS 21. An output 46 is formed at a junction of transistors 48 and 50.

A datum is represented by one of two possible states in which the bit cell circuit 12 may be maintained. For example, a logic one or high level is represented in the bit cell circuit 12 as node N 26 being at or near VSS 21 or ground potential and node D 24 being at or near VDD 19 or the power supply potential. A logic zero or low level is indicated by node D 24 being at or near VSS 21 or to the ground potential and node N 26 being at or near VDD 19 or the power supply potential.

For purposes of explanation, assume the bit cell circuit 12 stores a logic zero or low level, which indicates that node D 24 is at or near VSS 21 and node N 26 is at or near VDD 19. After the true bit line 20 and the complementary bit line 22 have been pre-charged to the power supply potential VDD 19 by pre-charge circuitry (not explicitly shown), the write line 28 becomes active, which turns on access transistors 17 and 34. Transistors 17 and 34 couple nodes 26 and 24 to the complementary bit line 22 and true bit line 20, respectively. Because node D 24 is at a low potential, transistor 15 is in an off or non-conducting state, and because node N 26 is at a high potential, transistor 36 is in an on or conducting state. When nodes 26 and 24 are coupled to the complementary bit line 22 and the true bit line 20, respectively, the conducting transistor 36 will begin to pull the potential on the true bit line 20 toward VSS 21 or the ground potential. Conversely, because transistor 15 remains in a non-conducting (or nearly non-conducting) state, the potential on the complementary bit line 22 remains at VDD 19 or the power supply potential through transistor 11. Transistors 23, 25, 48 and 50 utilize the potential on the true bit line 20 or the potential on the complementary bit line 22, or both, to produce an output 46 indicative of the datum stored in the bit cell circuit 12.

The read accelerator circuit 16 accelerates a discharge of the true bit line 20. The feedback circuit 18 conditionally clamps a voltage level developed on the bit lines 20 and 22. Nodes D 24 and N 26 are true and complementary nodes of the bit cell circuit 12, respectively.

Assume that a logic high level is stored in bit cell circuit 12; that is, node D 24 is at VDD 19 and node N 26 is at VSS 21. While writing a logic low level to the bit cell circuit 12, the true bit line 20 is discharged to VSS 21 and the complementary bit line 22 is held at VDD 19. Once the true bit line is discharged to VSS 21, the word line 28 is driven to VDD 19, which turns on transistors 17 and 34. Node D 24 discharges to VSS 21 through transistor 34 and switches transistor 13 on. Once transistor 13 is turned on, node N 26 is charged to VDD 19. Thus, when node D 24 is at VSS 21, the data that is stored is a logic low level.

Similarly, assume that a logic low level is stored in the bit cell circuit 12, which indicates that node D is at VSS 21 and node N is at VDD 21. During a read access of a logic low level, the word line 18 is activated, transistors 17 and 34 are turned on, and the true bit line 20 discharges via a static conduction path through transistors 34 and 36. Without the read accelerator circuit 16 and feedback circuit 18, the true bit line 20 would only be connected to the inverter sense amplifier circuit 14. As the true bit line 20 discharges below the threshold of transistor 23, transistor 23 drives the gates of transistors 48 and 50 to VDD 21, and the output 46 is driven to VSS 21, which results in the output 46 being at a logic low level.

During a read access of a logic low level, node D 24 will be at VSS 21, and node N 26 will be at VDD 21. Prior to the read access, both the true bit line 20 and the complementary bit line 22 are pre-charged to VDD 19. The word line 28 is then set to a logic low level, the read line 30 is set to a logic high level, the true and complementary bit lines 20 and 22, respectively, retain their pre-charge levels, and an output 32 of the inverter sense amplifier circuit 14 remains at a logic low level. During read operations, once the word line 28 is set to a logic high level, the true bit line 20 is discharged via a static conducting path through transistors 34 and 36 of the bit cell circuit 12. The discharge rate of the true bit line 20 is a function of the read current value, which is determined by a drive strength of transistors 34 and 36.

With increased statistical local variations of device characteristics across fabricated dies and increased memory density (e.g., beyond 100 Mb/die), yield is ensured by testing bit cell access times using a statistically worst-case value of the read current. For example, in 28-nm wafers, the worst-case value of the read current is about 30 percent less than standard values of the read current. Statistical analysis is used to determine the worst-case value of the read current, which is essentially a minimum read current based on one million samples. Generally a 90 percent yield with 100 Mb/die is sought. The worst-case read current is significantly lower than the nominal read current at standard process, voltage, and temperature (PVT) conditions in the absence of the read-assist features provided by the embodiments herein. Due to this degradation in read current, the true bit line 20 will take a longer period of time to discharge below a switching threshold point of the sense amplifier circuit 14, which substantially impacts the read access time of the bit cell circuit 12 (e.g., by as much as about 20 to 30 percent).

In the first embodiment, during a read access of a logic low level, the bit line pre-charge is disabled and the true and complementary bit lines 20, 22 will be at VDD 19 prior to the word line 28 being active at VSS 21. Once the word line 28 is active, the complementary bit line 22 remains at VDD 19, which cuts off PMOS transistor 38, and the true bit line 20 starts discharging through transistors 34 and 36 at a rate equal to the worst-case read current. The read line 30 turns on with the write line 28, which enables an additional conduction path through transistors 40, 42 and 44. This additional conduction path accelerates the rate of discharging the true bit line 20 from its initial pre-charged value of VDD 19, and continues until the true bit line 20 falls below a threshold voltage of NMOS transistor 42. Once the true bit line 20 falls below the threshold voltage of transistor 42, the read accelerator circuit 16 is cutoff and the true bit line 20 continues to discharge through transistors 34 and 36. Due to the accelerated discharge rate, the inverter sense amplifier circuit 14 senses the logic low level more quickly and increases the speed of the logic low-to-high level transition at the output 32 of the inverter sense amplifier circuit 14, which significantly increases the speed of the read operation.

The feedback transistor 38 does not necessarily function to accelerate the speed of the read access of a logic low level, since transistor 38 remains off during this time. That is, during a read access of a logic low level, when the write line 28 is turned on, the true bit line 20 discharges, but the complementary bit line 22 is held at VDD 19. Since the complementary bit line 22 is held at VDD 19, transistor 38 is switched off. Thus, the feedback transistor 38 does not function to accelerate speed of the read access of a logic low level.

During a read access of a logic high level, the bit line pre-charge is disabled and the true and complementary bit lines 20, 22 will be at VDD 19 prior to the world line 28 being active at VSS 21. Once a clock signal is triggered with the read signal, and following a prescribed duration of time, charging of the bit lines 20, 22 is disabled and the write line 28 is turned on. Once the word line 28 is active, the complementary bit line 22 discharges to VSS 21 through transistors 15 and 16 of the bit cell circuit 12, but the true bit line remains high at VDD 19. Prior to the word line 28 going active at VDD 19, the true and complementary bit lines 20, 22 are at VDD 19 and both output 46 and output 32 remain at their previous voltage levels, which are VDD 19 and VSS 21, respectively, even after the word line 28 goes high. Therefore, read access of a logic high level from the bit cell circuit 12 does not create a bottleneck for overall access times of the memory device. However, the conduction path through transistors 40, 42 and 44 of the read accelerator circuit 16, is enabled when the word line 28 goes active to VDD 19, which provides a discharge path for the true bit line 20 until the complementary bit line 22 discharges below VDD-VTP (where VTP represents a threshold voltage of PMOS transistor 38). Once the complementary bit line 22 discharges below VDD-VTP, transistor 38 turns on and starts restoring the voltage level of the complementary bit line 22 to VDD 19. Once the complementary bit line 22 discharges below the threshold voltage of transistor 44, the read accelerator circuit 16 is disabled (since transistor 44 is cutoff) which thereby prevents unexpected data sensing by the inverter sense amplifier circuit 14.

With reference now to FIG. 2, memory circuit 11 according to the second embodiment is shown. The memory circuit 11 differs from the memory circuit 10 shown in FIG. 1 by incorporating an additional output inversion circuit that includes PMOS transistor 27 and NMOS transistor 29, and an alternative read accelerator circuit 31 and feedback circuit 33. The gates of transistors 27 and 29 are coupled to transistors 23 and 25. The gates of transistors 48 and 50 are connected to transistors 27 and 29. Transistors 27 and 29 are connected between VDD 19 and VS 21. In addition, connections to the true bit line 20 in the first embodiment shown in FIG. 1 are substituted with connections to the complementary bit line 22 in the memory circuit 11 shown in FIG. 2.

Figure 3:
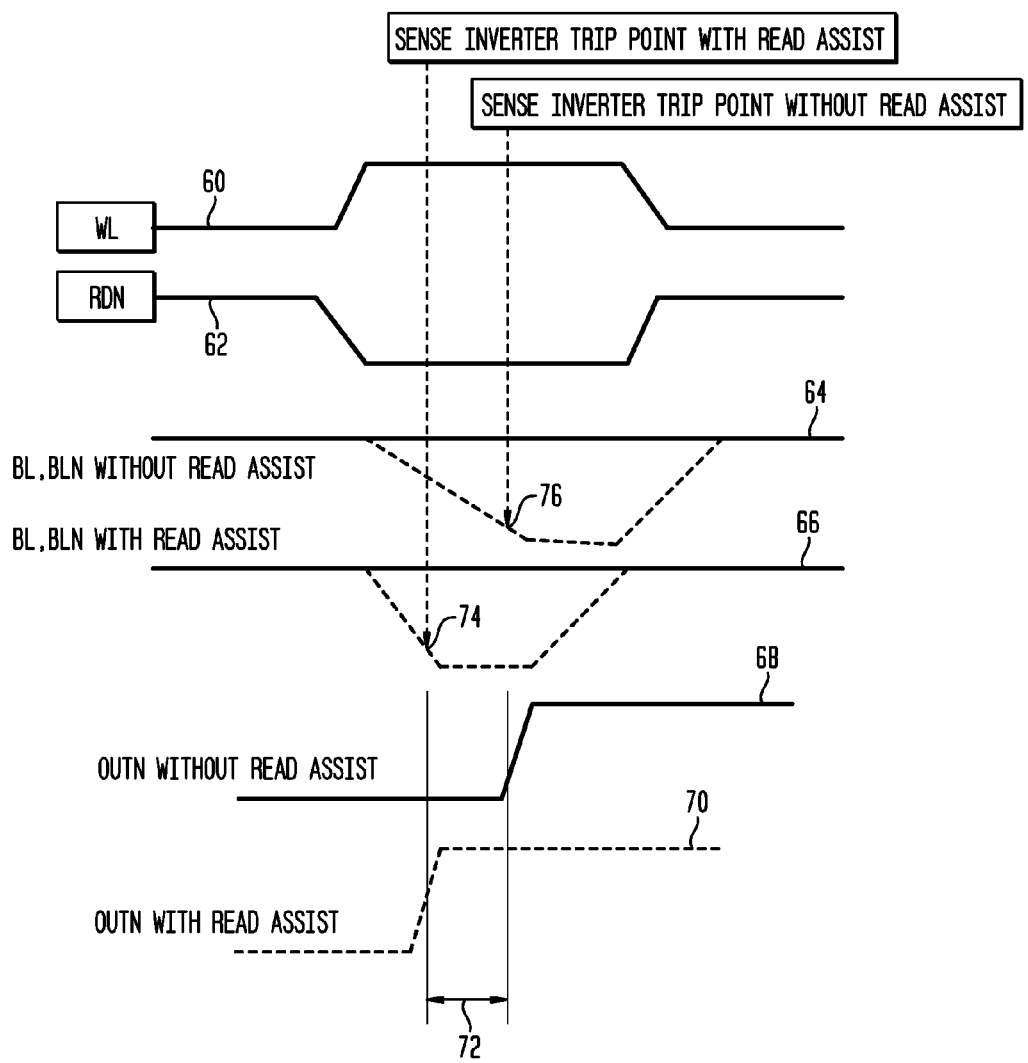
FIG. 3 is a timing diagram illustrating certain signal traces associated with the memory circuit shown in FIG. 1, with and without incorporation of the read-assist feature according to an embodiment of the invention.

FIG. 3 is a timing diagram illustrating certain signal traces associated with the memory circuit shown in FIG. 1, with and without incorporation of the read-assist feature according to an embodiment of the invention. Specifically, FIG. 3 shows a timing diagram including traces representing the true bit line 20, complementary bit line 22, and output 32 with and without the read-assist feature, which are represented in relation to the write line 28 and read line 30 during a read access of a logic low level. Trace 60 represents the write line 28, trace 62 represents the read line 30, trace 64 represents the true and complementary bit lines 20, 22 without the read-assist feature, trace 66 represents the true and complementary bit lines 20, 22 with the read-assist feature, trace 68 represents the output 32 without the read-assist feature, and trace 70 represents the output 32 with the read-assist feature. A period of time 72 represents an access time enhancement due to incorporation of the read-assist feature according to embodiments of the invention.

As apparent from FIG. 3, incorporation of the read-assist feature causes a slope of the falling edge of trace 66 to be greater than a slope of the falling edge of trace 64, which causes a trip point 74, 76 of the inverter sense amplifier circuit 14 to be achieved earlier in trace 66 when compared to trace 64, respectively. Thus, by incorporating the read-assist feature, the logic zero or low level will be sensed earlier, which is illustrated by comparing trace 70 with trace 68. This results in the read access time enhancement shown as time period 72.

It is to be understood that any or all of the embodiments described herein are implementable in any given system and/or device without requiring any specific set of embodiments or features. It is also to be noted that the embodiments described herein can be implemented with any type, length, width, and/or technology of electronic device. It is further to be noted that the ordering of steps and/or operations associated with the embodiments herein can be altered while remaining within the intended scope of the embodiments. It is further to be noted that transistors 40, 42, 44 can be connected in any order between transistor 38 and VSS 21 while remaining within the intended scope. It is yet further to be noted that alternative types of transistors and/or other electronic devices can be substituted for the transistors described above using means known in the art while remaining within the intended scope. For example, in an alternative embodiment, transistor 40 is an NMOS transistor and transistors 42 and 44 are PMOS transistors. In this alternative embodiment, additional inverters are used to modify the sense of signals applied to the gates of these transistors. In an alternative embodiment, a higher voltage power supply is connected during read accesses to a selected column of a memory device to increase the read current. This embodiment requires an additional on-die power supply. In this embodiment, the write line is connected to a voltage that is greater than VDD, VDD-HIGH, to increase the read current. Driving the WORD LINE to VDD_HIGH is not provided for at the die level, but is rather provided for by another device at the chip level, which substantially increases size requirements in addition to requiring another power supply.

Figure 4:
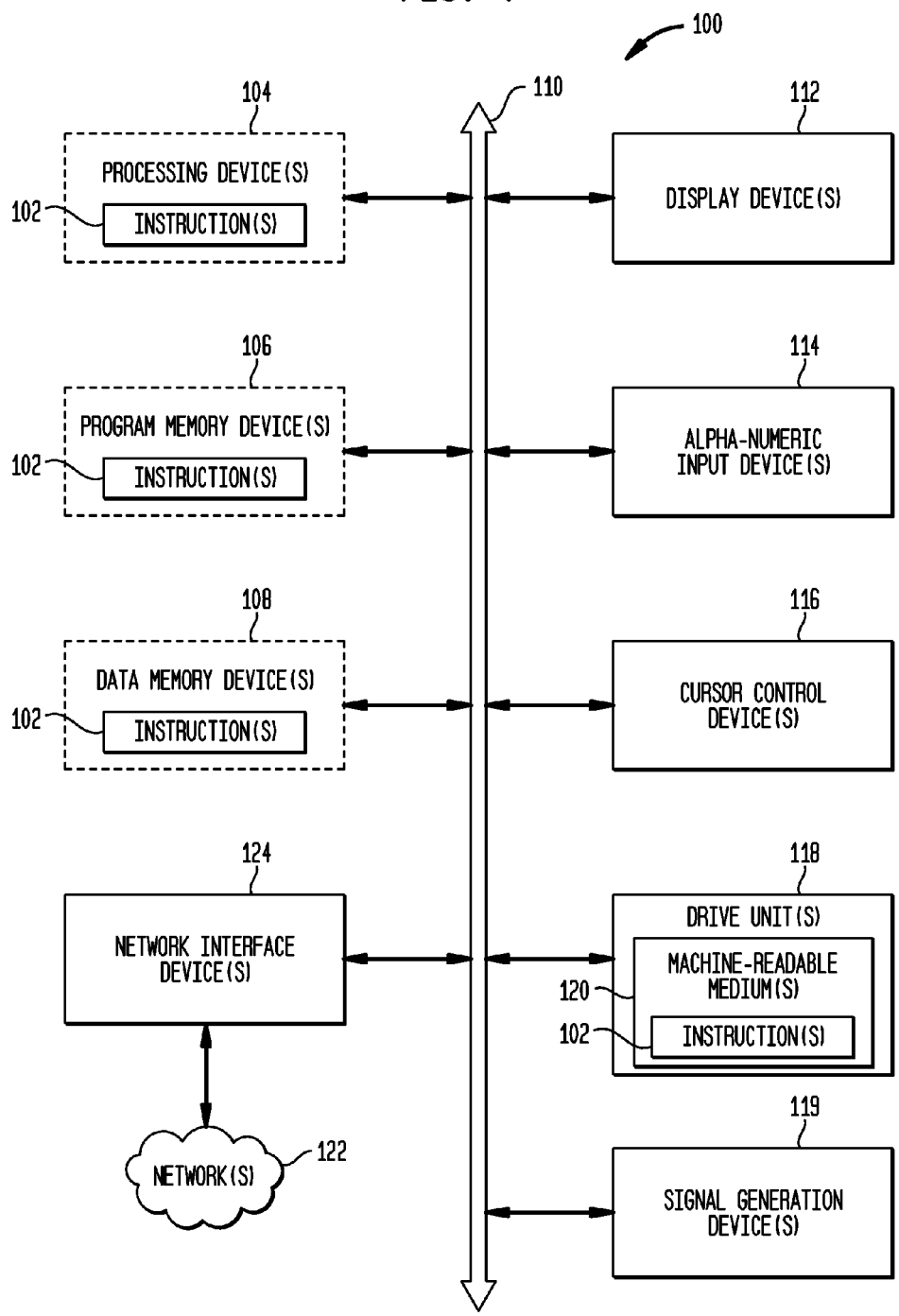
FIG. 4 is a block diagram depicting at least a portion of an exemplary apparatus in the form of a computing system configured to perform methods according to one or more embodiments of the invention.

FIG. 4 is a block diagram depicting at least a portion of an exemplary apparatus in the form of a computing system 100 configured to perform methods according to one or more embodiments of the invention. The computing system 100 includes a set of instructions 102 that, when executed, cause the apparatus to perform any one or more of the methodologies according to embodiments of the invention. In some embodiments, the apparatus operates as a standalone device. In some embodiments, the apparatus is connected (e.g., via a network 122) to other apparatus. In a networked embodiment, the apparatus operates in the capacity of a server or a client user machine in a server-client user network environment. Exemplary implementations of the apparatus in accordance with embodiments of the invention include, but are not limited to, a server computer, client user computer, personal computer (PC), tablet PC, Personal Digital Assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that apparatus.

The computing system 100 includes a processing device(s) 104 (e.g., a central processing unit (CPU), a graphics processing unit (GPU), or both), program memory device(s) 106, and data memory device(s) 108, which communicate with each other via a bus 110. The computing system 100 further includes display device(s) 112 (e.g., liquid crystals display (LCD), flat panel, solid state display, or cathode ray tube (CRT)). The computing system 100 includes input device(s) 114 (e.g., a keyboard), cursor control device(s) 116 (e.g., a mouse), disk drive unit(s) 118, signal generation device(s) 119 (e.g., a speaker or remote control), and network interface device(s) 124, operatively coupled together, and/or with other functional blocks, via bus 110.

The disk drive unit(s) 118 includes machine-readable medium(s) 120, on which is stored one or more sets of instructions 102 (e.g., software) embodying any one or more of the methodologies or functions herein, including those methods illustrated herein. The instructions 102 also reside, completely or at least partially, within the program memory device(s) 106, the data memory device(s) 108, and/or the processing device(s) 104 during execution thereof by the computing system 100. The program memory device(s) 106 and the processing device(s) 104 also constitute machine-readable media. Dedicated hardware implementations, such as but not limited to application specific integrated circuits, programmable logic arrays, and other hardware devices can likewise be constructed to implement the methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 102, or that which receives and executes instructions 102 from a propagated signal so that a device connected to a network 122 can send or receive voice, video or data, and to communicate over the network 122 using the instructions 102. The instructions 102 are further transmitted or received over the network 122 via the network interface device(s) 124. The machine-readable medium also contains a data structure for storing data useful in providing a functional relationship between the data and a machine or computer in an illustrative embodiment of the systems and methods herein.

While the machine-readable medium 102 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions or logic herein, are optionally stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiments are not limited to such standards and protocols.

At least a portion of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which memory may be employed. Suitable systems for implementing techniques of embodiments of the invention may include, but are not limited to, servers, personal computers, data storage networks, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the structure of the various embodiments, and they are not intended to serve as a complete description of all the elements and features of apparatus and systems that might make use of the structures described herein. Many other embodiments will become apparent to those of skill in the art upon reviewing the above description. Other embodiments are utilized and derived therefrom, such that structural and logical substitutions and changes are made without departing from the scope of this disclosure. Figures are also merely representational and are not necessarily drawn to scale. Certain proportions thereof may be exaggerated, while others diminished in order to facilitate an explanation of the embodiments of the invention. Accordingly, the specification and drawings are to be regarded in an illustrative rather than a restrictive sense.

Such embodiments of the inventive subject matter are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the Detailed Description, with each claim standing on its own as a separate example embodiment.

The Abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings of the invention provided herein, one of ordinary skill in the art will be able to contemplate other implementations and applications of the techniques of the invention. Although illustrative embodiments of the invention have been described herein with reference to the accompanying drawings, it is to be understood that the invention is not limited to those precise embodiments, and that various other changes and modifications are made therein by one skilled in the art without departing from the scope of the appended claims.

What is claimed is:

1. An electronic storage device, comprising:
    a bit cell circuit adapted for connection with a first bit line and a second bit line in the storage device;
    a feedback circuit, the feedback circuit comprising a first transistor, the first transistor being operatively coupled to a first voltage potential, the first transistor being responsive to the first bit line; and
    a read accelerator circuit, the read accelerator circuit comprising second, third, and fourth transistors, the second, third, and fourth transistors being operatively coupled between the feedback circuit and a second voltage potential, the second transistor being responsive to a read line, the third transistor being responsive to the second bit line, the fourth transistor being responsive to the first bit line, the read accelerator circuit being configured to provide a discharge path for at least one of the first bit line and the second bit line during a read access of the bit cell.

2. The electronic storage device as defined by claim 1, wherein at least one of the first, second, third, and fourth transistors comprises a metal-oxide semiconductor transistor.

3. The electronic storage device as defined by claim 1, wherein the first and second transistors comprise a p-channel metal-oxide semiconductor transistor, the third and fourth transistors comprising an n-channel metal-oxide semiconductor transistor.

4. The electronic storage device as defined by claim 1, wherein the first voltage potential is greater than the second voltage potential.

5. The electronic storage device as defined by claim 1, further comprising a sense circuit, the sense circuit being operatively coupled with a node between the feedback circuit and the read accelerator circuit.

6. The electronic storage device as defined by claim 1, wherein the first bit line is operatively coupled to a gate of the first transistor, the read line being operatively coupled to a gate of the second transistor, the second bit line being operatively coupled to a gate of the third transistor, and the first bit line being operatively coupled to a gate of the fourth transistor.

7. The electronic storage device as defined by claim 1, wherein the first bit line is a true bit line and the second bit line is a complementary bit line.

8. The electronic storage device as defined by claim 1, wherein the second bit line is a true bit line and the first bit line is a complementary bit line.

9. The electronic storage device as defined by claim 1, wherein at least a portion of the electronic storage device is fabricated in at least one integrated circuit.

10. An electronic read access accelerator device, comprising:
- a feedback circuit, the feedback circuit comprising a first transistor, the first transistor being adapted for connection with a first voltage potential, the first transistor being responsive to a signal developed on a first bit line in an electronic storage device; and
- a read accelerator circuit, the read accelerator circuit comprising second, third, and fourth transistors, the second, third, and fourth transistors being operatively coupled between the feedback circuit and a second voltage potential, the second transistor being responsive to a signal conveyed by a read line in the electronic storage device, the third transistor being responsive to a signal developed on a second bit line in the electronic storage device, the fourth transistor being responsive to the signal developed on the first bit line, the read accelerator circuit being configured to provide a discharge path for at least one of the first bit line and the second bit line during a read access of the electronic storage device.

11. The electronic read access accelerator device as defined by claim 10, wherein at least one of the first, second, third, and fourth transistors comprises a metal oxide semiconductor transistor.

12. The electronic read access accelerator device as defined by claim 10, wherein the first and second transistors comprise a p-channel metal-oxide semiconductor transistor, the third and fourth transistors comprising an n-channel metal-oxide semiconductor transistor.

13. The electronic read access accelerator device as defined by claim 10, wherein the first voltage potential is greater than the second voltage potential.

14. The electronic read access accelerator device as defined by claim 10, further comprising an inverter sense circuit, the inverter sense circuit being operatively coupled to a node between the feedback circuit and read accelerator circuit.

15. The electronic read access accelerator device as defined by claim 10, wherein the first bit line is connected to a gate of the first transistor, the read line is operatively coupled to a gate of the second transistor, the second bit line is operatively coupled to a gate of the third transistor, the first bit line is operatively coupled to a gate of the fourth transistor.

16. The electronic read access accelerator device as defined by claim 10, wherein the first bit line is a true bit line and the second bit line is a complementary bit line.

17. The electronic read access accelerator device as defined by claim 10, wherein the second bit line is a true bit line and the first bit line is a complementary bit line.

18. The electronic read access accelerator device as defined by claim 10, wherein at least a portion of the electronic read access accelerator device is fabricated in at least one integrated circuit.

19. A method of accelerating a read access associated with an electronic storage device, the method comprising steps of:
- coupling a feedback circuit operatively to a first voltage potential, the feedback circuit comprising a first transistor, the first transistor being responsive to a signal developed on a first bit line in the electronic storage device;
- coupling a read accelerator circuit operatively between the feedback circuit and a second voltage potential, the read accelerator circuit comprising second, third, and fourth transistors, the second transistor being responsive to a signal conveyed by a read line in the electronic storage device, the third transistor being responsive to a signal developed on a second bit line in the electronic storage device, the fourth transistor being responsive to the signal developed on the first bit line; and
- configuring the read accelerator circuit to provide a discharge path for at least one of the first bit line and the second bit line during the read access of the electronic storage device.

20. The method, as defined by claim 19, further comprising configuring at least one of the first, second, third, and fourth transistors to be a metal-oxide semiconductor transistor.

21. The method, as defined by claim 19, further comprising:
- configuring the first and second transistors to be a p-channel metal-oxide semiconductor transistor; and
- configuring the third and fourth transistors to be an n-channel metal-oxide semiconductor transistor.

22. The method, as defined by claim 19, further comprising configuring the first voltage potential to be greater than the second voltage potential.

23. The method, as defined by claim 19, further comprising coupling a sense circuit operatively to a node between the feedback circuit and read accelerator circuit.

24. The method, as defined by claim 19, further comprising:
- coupling the first bit line operatively to a gate of the first transistor;
- coupling the read line operatively to a gate of the second transistor;
- coupling the second bit line operatively to a gate of the third transistor; and
- coupling the first bit line operatively to a gate of the fourth transistor.

25. The method, as defined by claim 19, wherein the first bit line is a true bit line and the second bit line is a complementary bit line.

26. The method, as defined by claim 19, wherein the second bit line is a true bit line and the first bit line is a complementary bit line.

* * * * *